United States Patent
Maeda et al.

(10) Patent No.: US 6,562,134 B1
(45) Date of Patent: May 13, 2003

(54) CRYSTAL GROWING DEVICE AND METHOD OF MANUFACTURING SINGLE CRYSTAL

(75) Inventors: Hiroshi Maeda, Kitaibaraki (JP); Ryuichi Hirano, Kitabaraki (JP); Tetsuya Yamamoto, Kitaibaraki (JP); Akira Hichiwa, Kitaibaraki (JP); Yoshiaki Kubota, Himeji (JP)

(73) Assignees: Nikko Materials Co., Ltd., Tokyo (JP); Hirochiku Co., Ltd., Hyogo (JP)

( * ) Notice: Subject to any disclaimer, the term of this patent is extended or adjusted under 35 U.S.C. 154(b) by 0 days.

(21) Appl. No.: 09/868,087

(22) PCT Filed: Jul. 5, 2000

(86) PCT No.: PCT/JP00/04456
§ 371 (c)(1),
(2), (4) Date: Jun. 15, 2001

(87) PCT Pub. No.: WO01/27359
PCT Pub. Date: Apr. 19, 2001

(30) Foreign Application Priority Data

Oct. 15, 1999 (JP) .......................................... 11-293953

(51) Int. Cl.$^7$ .............................................. C30B 35/00
(52) U.S. Cl. ......................... 117/222; 117/11; 117/224
(58) Field of Search ............................ 117/11, 222, 224

(56) References Cited

U.S. PATENT DOCUMENTS 6,290,773 B1 * 9/2001 Mizuniwa et al. ............. 117/81
6,409,831 B2 * 6/2002 Mizuniwa et al. ............. 117/204

FOREIGN PATENT DOCUMENTS

| JP | A4318923 | 11/1992 |
| JP | A6256082 | 9/1994 |
| WO | WO 9522643 | 8/1995 |

* cited by examiner

Primary Examiner—Felisa Hiteshew
(74) Attorney, Agent, or Firm—Birch, Stewart, Kolasch & Birch, LLP

(57) ABSTRACT

A crystal growth apparatus comprising a heating furnace capable of controlling uniformly the temperature distribution in the same horizontal plane, and a method for producing a single crystal by using the crystal growth apparatus are provided. In the crystal growth apparatus comprising a cylindrical heating furnace (110) having plural heaters (101, 102, 103 and 104) laminated in multi-stage in an axial direction (Z), each heater is disposed for the terminal portions of the adjacent heaters not to be overlapped in the same position, but to be in a mutually separated position, seeing from the axial direction of the heating furnace. Concretely, in case of N (n is a positive integer of three or more) heaters, each heater (101, 102, 103 and 104) is disposed for the terminal portions (110a, 102a, 103a and 104a) of the heaters to be located at each apex of a regular n-gon (n is an integer satisfying $3 \leq n \leq N$), seeing from the axial direction Z of the heating furnace.

20 Claims, 5 Drawing Sheets

TEMPERATURE DISTRIBUTION IN THE FURNACE

CRYSTAL GROWING DEVICE AND METHOD OF MANUFACTURING SINGLE CRYSTAL

This application is the national phase under 35 U.S.C. §371 of PCT International Application No. PCT/JP00/04456 which has an International filing date of Jul. 5, 2000, which designated the United States of America and was not published in English.

TECHNICAL FIELD

The present invention relates to a crystal growth apparatus comprising a heating furnace, which has a multi-stage heater. Particularly, it relates to a crystal growth apparatus of a compound semiconductor that requires a precise temperature control, and to an effective technology applied to a crystal growth method by using the crystal growth apparatus.

BACKGROUND ART

Generally, the vertical gradient freezing (VGF) method, vertical Bridgman (VB) method, horizontal gradient freezing (HGF) method and horizontal Bridgman (HB) method or the like have been known as methods for growing a compound semiconductor single crystal. In these methods, a compound semiconductor single crystal is grown by utilizing the temperature gradient in a growth furnace.

In a crystal growth apparatus to which such a growth method is applied, in order to realize the desired temperature gradient, there is a case that a heating furnace having a multi-stage heater is used. As an invention using a heating furnace having a multi-stage heater, there is, for example, the invention described in the International Publication No. WO95/22643. In this invention, by utilizing the VGF method, the temperature distribution in a heating furnace is controlled so that a first vertical temperature gradient in vicinity of the external wall of the quartz ampoule corresponding to a raw material melt may be smaller than a second vertical temperature gradient above the upper end of a crucible. Then, the temperature in the heating furnace is decreased gradually, for the crystal to be grown toward the lower side from a surface of the raw material melt.

Further, in the prior application, in order to control the temperature gradient accurately, a crystal growth apparatus comprising a heating furnace having at least six heating means (heaters), is suggested. A schematically sectional view of the crystal growth apparatus is shown in FIG. 5. In FIG. 5, the crystal growth apparatus 100 comprises a heating furnace 110 having an upper stage heater portion 101 to 104 and a lower stage heater portion 105 to 107, a control device, which controls the furnace internal temperature distribution or the like by controlling electric energy to each heater, and a power source device. A quartz ampoule 111 having a reservoir portion 111A, in which a crucible 112 made of pBN and charged with a raw material 113 is sealed, is disposed in the heating furnace 110. The heating furnace 110 comprises a heater 103, which controls the first temperature gradient by heating the position corresponding to the crucible 112, a heater 102, which controls the second temperature gradient by heating the space above the upper end of the crucible 112, a heater 106, which controls the vapor pressure by heating the reservoir portion 111A, heaters 101 and 107, which suppress the influence of disturbance to the furnace internal temperature distribution, and heaters 104 and 105, which suppress the mutual influence between the heater 103 and the heater 106.

According to the crystal growth apparatus, since the heaters are in multi-stage, it is possible to control extremely satisfactorily the first temperature gradient and the second temperature gradient, and there is the advantage that the yield of a single crystal substrate can be improved rapidly.

However, in growth of a compound semiconductor single crystal by using the above-described crystal growth apparatus having a multi-stage heater, although it is possible to improve the yield of a single crystal substrate, when aiming at an inplane dopant (impurity) concentration of a obtained wafer, it was found by an experiment that there is dispersion at least beyond the measurement error in a plane.

The present inventors repeated eagerly researches about the case. When a crystal is grown by using the above-described crystal growth apparatus, the temperature distribution around the crystal was measured in the same horizontal plane along the circumferential direction, and only one place was evidently low, compared with the others. Then, the temperature distribution was compared with the inplane dopant concentration distribution of the wafer, and it was noticed that the temperature distribution is corresponding to the inplane dopant concentration distribution. Therefore, it is reached to the conclusion that solidifying process of a crystal is shifted in the same plane since the inplane temperature distribution of the heating furnace is not uniform, and consequently, dispersion of the inplane dopant concentration of the wafer occurs.

Furthermore, it is found that in the inplane temperature distribution in the furnace, the region that the temperature is low is corresponding to the position of the terminals of the heaters. Therefore, it is ascertained that heat radiation from the terminal portions of the heaters is the cause of the inplane temperature distribution in the furnace not being uniform. A perspective view of the upper stage heater portions 101 to 104 in FIG. 5, is shown in FIG. 6. The heaters and a power source device or a control device are connected through wirings. However, in the conventional crystal growth apparatus, the terminal portions 101a to 104a, which are taken out from each heater, were always disposed in the same place on the circumference, seeing from the axial direction of the heating furnace, in order to be wired easily. In this case, since there is heat radiation from the terminal portions, the furnace internal temperature in vicinity of the terminal portions was decreased somewhat, so that the temperature distribution in the same horizontal plane in the furnace was dispersed delicately.

The present invention was made to solve the problem. The objects of the invention are to provide a crystal growth apparatus comprising a heating furnace, which can control the temperature distribution in the same horizontal plane in the furnace, and to provide a method for producing a single crystal by using the crystal growth apparatus.

DISCLOSURE OF INVENTION

In order to accomplish the objects, in the present invention, a crystal growth apparatus comprises a cylindrical heating furnace having a multi-stage heater, and the inplane temperature distribution in a heating furnace is made to become uniform without gathering terminal portions taken out from each heater in one place.

Concretely, when the number of the heaters is, for example, two, each heater may be disposed so that the terminals may be located at an almost facing position. Further, when the number of the heaters is N (N is a positive integer of three or more), each heater may be disposed so that the terminal portions of the heaters may be located at each apex of a regular n-gon (n is an integer which satisfies $3 \leq n \leq N$), seeing from the axial direction of the heating furnace. Therefore, since heat radiation from the terminal portions does not occur at one place, it is possible to uniform the inplane temperature distribution in the heating furnace.

In order to grow a single crystal by using the crystal growth apparatus, for example, a heat-resistant container charged with a raw material is disposed in the heating furnace portion of the crystal growth apparatus. The heater is controlled and a predetermined temperature distribution is made in the furnace. Then, after melting the raw material by heating the heat-resistant container portion to be over the melting point of the raw material, the crystal is grown preferably by decreasing the temperature of the heating furnace gradually, while maintaining the temperature distribution. Thereby, the uniformity of the inplane dopant concentration of a wafer obtained can be improved sharply.

Further, a crystal growth apparatus of a compound semiconductor comprises a heating furnace having an upper stage heater portion heating a crucible portion charged with a raw material of a compound semiconductor, and a lower stage heater portion heating a reservoir portion communicated with a quartz ampoule sealing the crucible. The upper stage heater portion is constituted of N numbers of heaters, which are laminated in multi-stage in an axial direction. Each heater is disposed in order for the terminal portion of each heater in the upper stage heater portion to be located at each apex of a regular N-gon, seeing from the axial direction of the heating furnace. Moreover, each heater may be disposed in order for the terminal portion of each heater in the upper stage heater portion to draw a spiral along the external circumference of the heating furnace. Thereby, the inplane temperature distribution of the raw material portion can be maintained uniform in the upper stage heater portion. Moreover, a volatile element disposed in the reservoir portion is evaporated by heating the reservoir portion in the lower stage heater portion and the pressure in the sealed container can be controlled by the vapor pressure. Additionally, a point defect in the crystal can also be prevented from occurring by volatilization of an easily volatile component.

In order to grow a compound semiconductor single crystal by using the crystal growth apparatus comprising a cylindrical heating furnace having an upper stage heater portion and lower stage heater portion, for example, a crucible charged with a raw material of a compound semiconductor is disposed in a quartz ampoule that has a reservoir portion, and a simple substance or a compound, which consists of at least one kind of volatile element among the constituent elements of the compound semiconductor, is charged into the reservoir portion of the quartz ampoule. Then, the quartz ampoule is disposed in the crystal growth apparatus so that the crucible may be located at inside of the upper stage heater portion and the reservoir portion may be located at inside of the lower stage heater. The upper stage heater portion is controlled and a predetermined temperature distribution is made in the furnace. Then, after melting the raw material of the compound semiconductor by heating the crucible portion over the melting point of the raw material, the volatile element is evaporated by heating the reservoir portion in the lower stage heater portion, so that the pressure in the quartz ampoule is controlled by the vapor pressure. The crystal is grown preferably by decreasing the temperature in the heating furnace, while maintaining the temperature distribution. Therefore, in production of a compound semiconductor single crystal, the inplane dopant concentration of an obtained semiconductor wafer can be improved sharply. Further, a point defect in a crystal can be prevented from occurring by volatilization of an easily volatile component.

PREFERRED EMBODIMENT OF THE INVENTION

Hereinafter, a preferred embodiment according to the present invention will be explained with reference to the drawings.

Figure 1A:
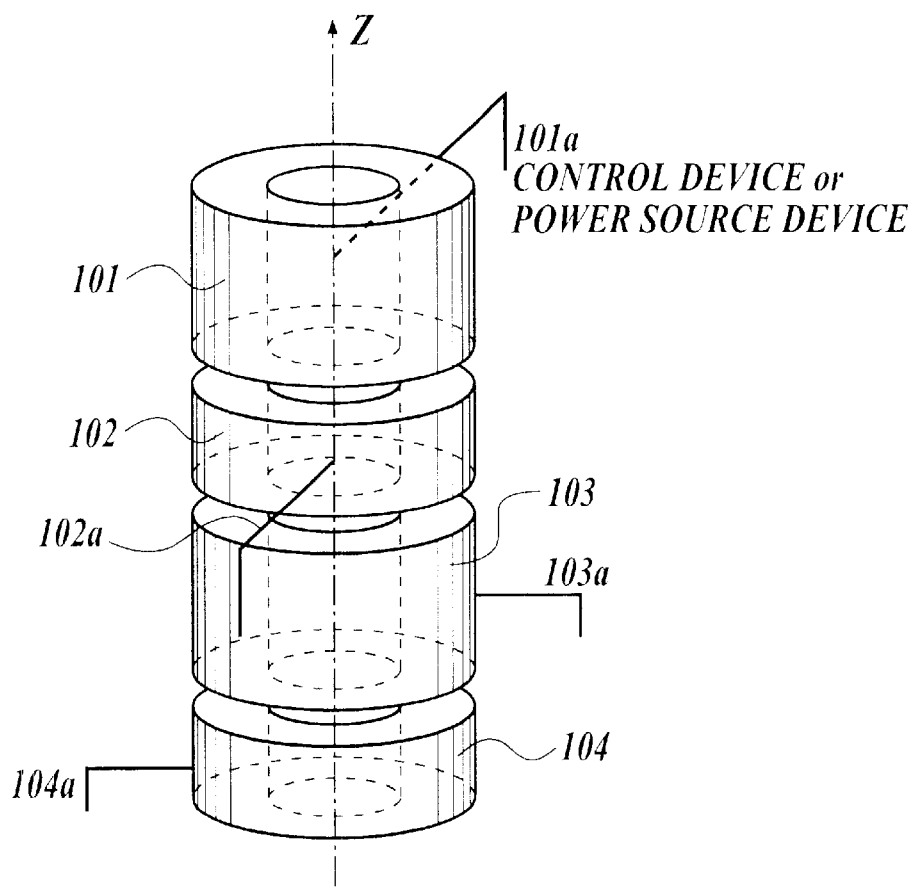
FIGS. 1A and 1B is a perspective view and a top view showing a schematic of the upper stage heater portion of the heating furnace of an embodiment.
Figure 1B:
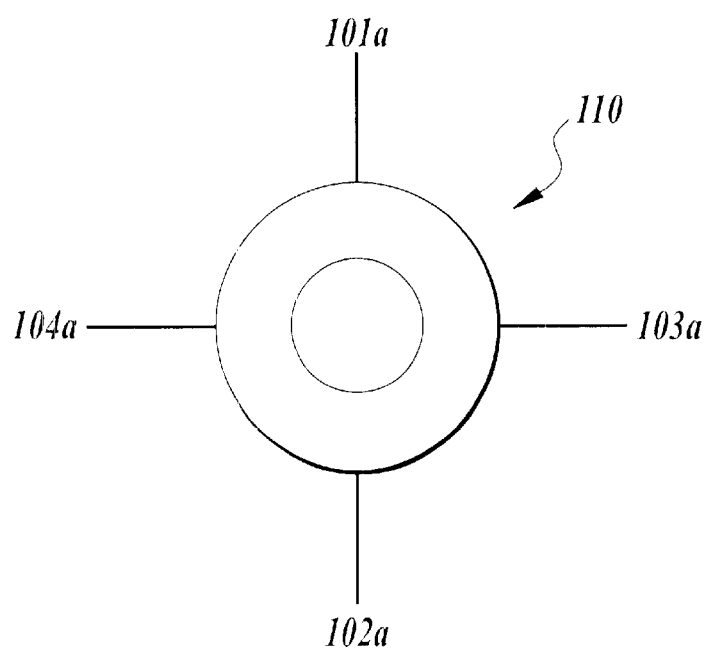
Figure 5:
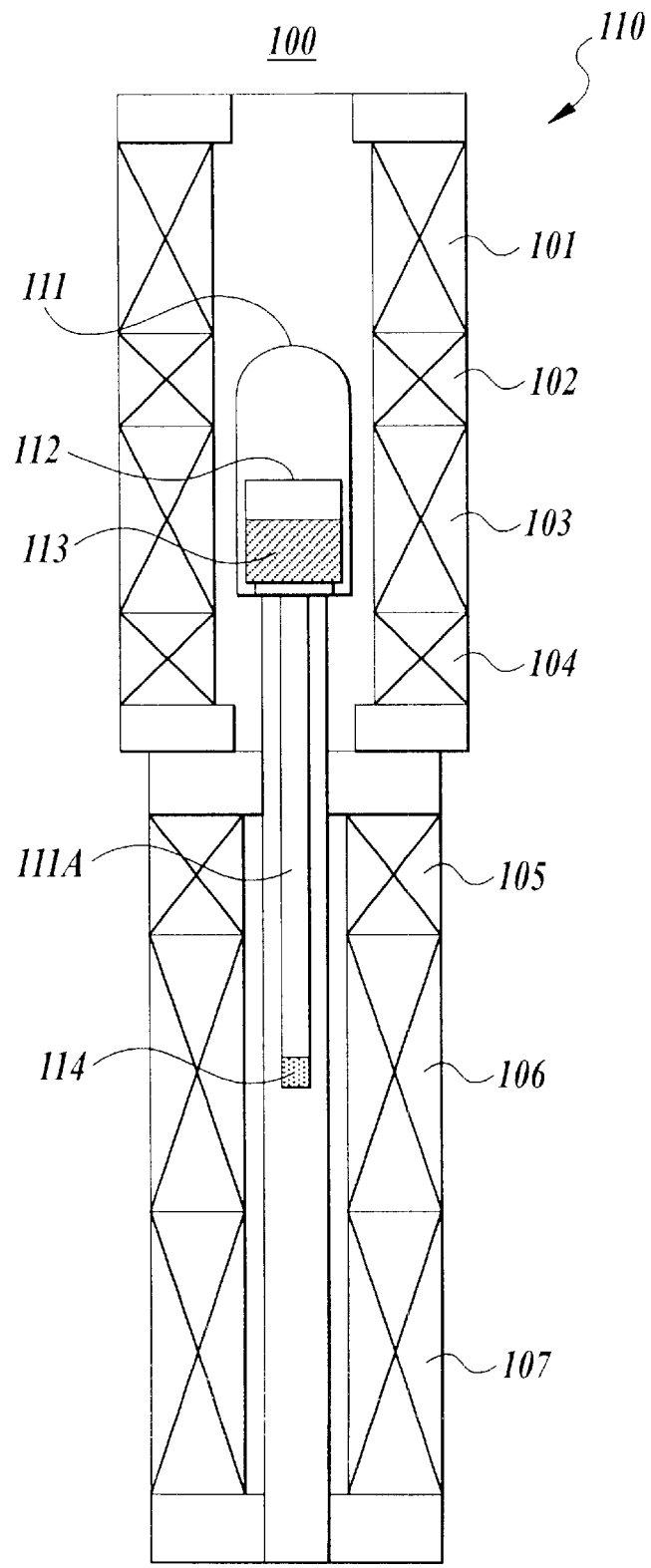
FIG. 5 is a sectional view showing a schematic of a conventional crystal growth apparatus.

The crystal growth apparatus of the embodiment is almost structurally same as the crystal growth apparatus shown in FIG. 5, while only the structure of the upper stage heater portion of the heating furnace 110 is different. FIG. 1 is a schematic view of the upper stage heater portion of the heating furnace of the embodiment, wherein 1A is a perspective view and 1B is a top view. The upper stage heater portion of the heating furnace 110 of the embodiment has four heaters 101 to 104. Each heater 101 to 104 is disposed in order for the terminal portions 101a to 104a of each heater 101 to 104 to be located at each apex of a square, seeing from the axial direction Z of the heating furnace 110. Moreover, in the embodiment, the terminal portions 101a to 104a of each heater 101 to 104 are disposed in order to be located at the following position. The second stage heater 102 is disposed so that its terminal portion 102a may be located at the position of 180° shifted from the terminal portion 101a of the first stage heater 101. The third stage heater 103 is disposed so that its terminal portion 103a may be located at the position of 90° shifted from the terminal portion 102a of the second stage heater 102. The fourth stage heater 104 is disposed so that its terminal portion 104a may be located at the position of 180° shifted from the terminal portion 103a of the third stage heater 103. As the embodiment, it is desirable to make a structure such that the terminal positions of the up-and-down adjacent heaters are not close preferably.

Figure 2:
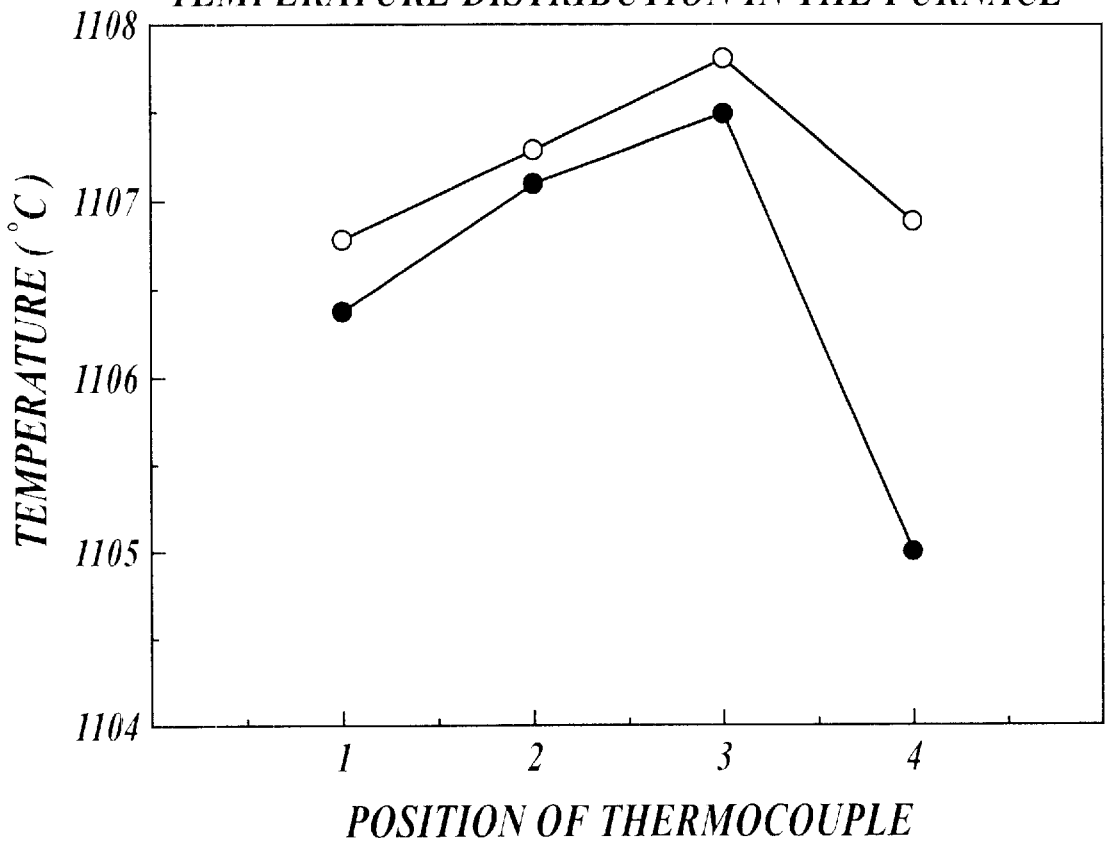
FIG. 2 is a graph showing the inplane temperature distributions in the heating furnaces.
Figure 3:
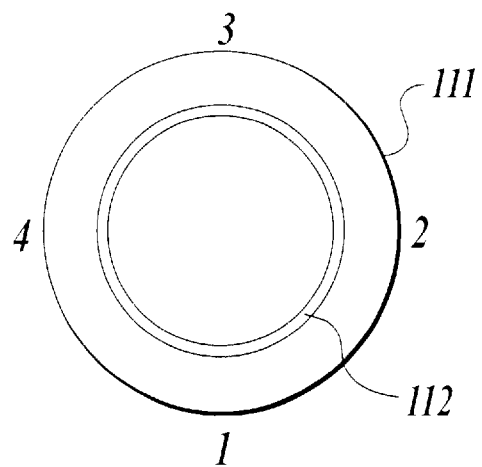
FIG. 3 is a top view in a heating furnace showing an installation position of thermocouples.

The above is the constitution of the crystal growth apparatus according to the embodiment, mainly the constitution of the upper stage heater portion of the heating furnace. According to the above-described crystal growth apparatus, it is possible to make the inplane temperature distribution in the heating furnace uniform. For example, the result of the temperature distribution measured by four thermocouples when the heating furnace was heated approximately at 1107° C., is shown in FIG. 2. Here, as shown in FIG. 3 with reference numerals 1, 2, 3 and 4, the four thermocouples are disposed around a quartz ampoule in order each to be located at the apex of the square in the same horizontal plane. The temperature distribution in the heating furnace of the embodiment is shown in FIG. 2 with white circles ○. The lowest portion was 1106.8° C. (position 1) and the highest portion was 1107.8° C. (position 3), thereby, the temperature difference was about 1° C. On the contrary, the inplane temperature distribution in the heating furnace of a conventional heater structure is shown with black circles ●. The lowest portion was 1105.0° C. (position 4) and the highest portion was 1107.5° C. (position 3), thus, the temperature difference was 2.5° C. In the conventional heating furnace, only the temperature of one place (position 4) was extremely low. However, it was improved by making the terminal positions of the heaters as the embodiment, and it is found out that the inplane temperature distribution in the heating furnace was unified.

Next, as an example, the case a CdZnTe single crystal is grown by the VGF method, using the crystal growth apparatus, will be explained.

At first, a Cd simple subs is an easily volatile element was charged into a reservoir portion 111A of a quartz ampoule 111, and a CdZnTe raw material 113 was charged into a crucible 112 and disposed in the quartz ampoule 111. After the quartz ampoule 111 was vacuum-sealed, the quartz ampoule 111 was installed at a predetermined position in the crystal growth apparatus. Then, the temperature was controlled in the upper stage heater so that the temperature gradient of the axial direction of above the crucible would be 2 to 3° C./cm and the temperature gradient of the axial direction of the crucible portion would be 2 to 3° C./cm. Then, the crucible was heated so that the temperature would be slightly higher than the melting point (1092° C.) of the CdZnTe raw material 113, so that the CdZnTe raw material was melted. In the lower stage heater 105 to 107, the Cd 114 in the reservoir portion 101A was heated approximately at 780° C. and evaporated, and vapor pressure control was made. At this time, the initial Zn concentration in the CdZnTe raw material melt 113 was made into 4.2%. Thereafter, the pressure in the quartz ampoule was controlled, and the inside of the heating furnace was cooled gradually at 0.1° C./hr, while maintaining the two temperature gradient, so that the CdZnTe single crystal with a diameter of four inches was grown.

Figure 4A:
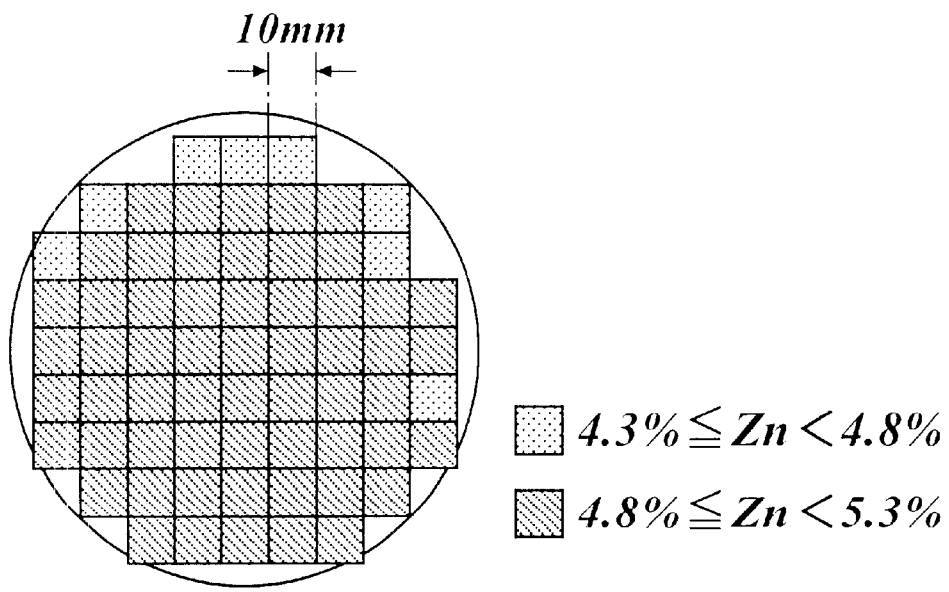
FIGS. 4A and 4B is mapping data showing the inplane Zn concentrations of semiconductor wafers.

The obtained CdZnTe single crystal was sliced to be a CdZnTe wafer. The surface Zn concentration with respect to the wafer, the solidification ratio thereof around g=0.3, was measured by a diode array type spectroscope MMS1 (made by Carl Zeiss Inc., Ltd.). The result is shown in FIG. 4A with mapping data. The Zn concentration is 4.8 to 5.3% in most (58/66) of the wafer, so that it is found that the single crystal has good uniformity.

Comparative Example

Figure 6:
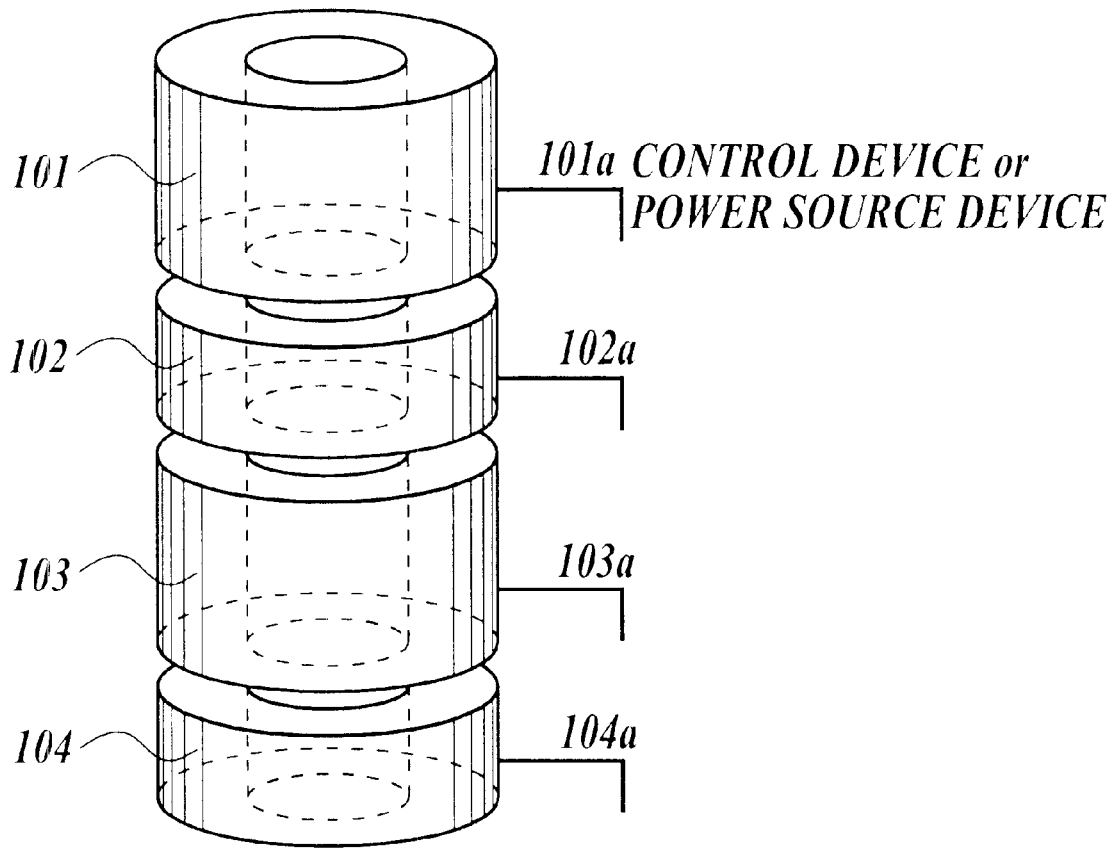
FIG. 6 is a perspective view showing a schematic of an upper stage heater portion of a conventional heating furnace.

A CdZnTe single crystal was also grown by using the conventional crystal growth apparatus, in which the upper stage heater portion of the heating furnace 110 has the structure shown in FIG. 6, and was compared with the case using the crystal growth furnace of the embodiment.

Figure 4B:
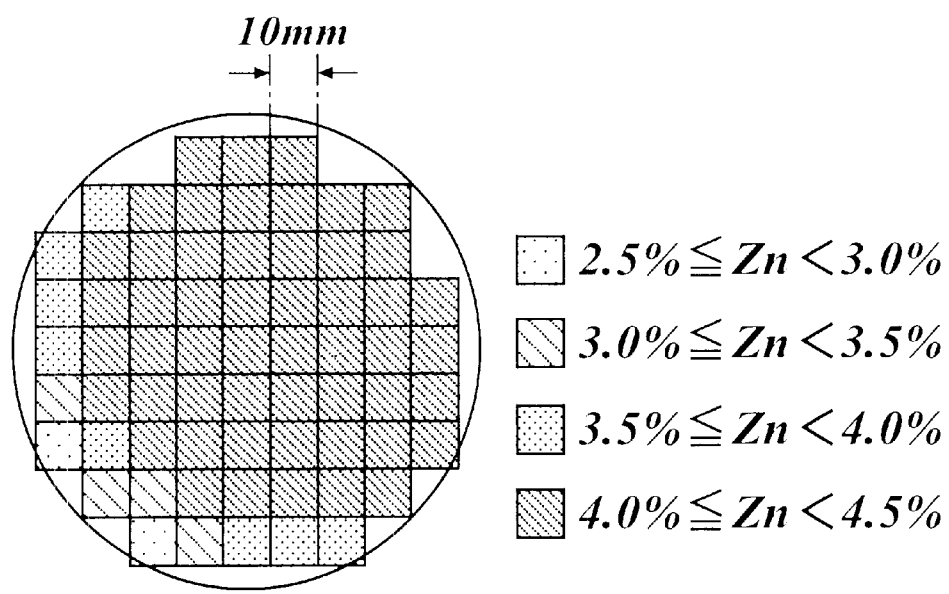

The obtained CdZnTe single crystal was sliced to be a CdZnTe wafer. Then, the surface Zn concentration with respect to the wafer, the solidification ratio thereof around g=0.5, was measured by a diode array type spectroscope MMS1, and the result is shown in FIG. 4B with mapping data. While Zn concentration in most (52/66) of the wafer is 4.0 to 4.5%, however, the Zn concentration is decreased at the wafer circumference portion. In the lower left portion in the figure, the Zn concentration is extremely low, being 2.5 to 3.0%, so that it cannot say that it is excellent in uniformity.

From the above, by using the crystal growth apparatus of the embodiment, the uniformity of the inplane temperature distribution in the furnace in crystal growth process is greatly improved, and it is found out that the dopant concentration in the CdZnTe single crystal obtained can be made uniform in the same plane.

In the above, the present invention is described based on the embodiment. However, the present invention is not limited to the embodiment.

For example, in the embodiment, the heating furnace, wherein the upper stage heater portion having four-stage heater, is used. However, the present invention can be applied to a heating furnace if it has a multi-stage heater. For example, the upper stage heater portion may have two-stage or three-stage heater, or five or more stage heater. When a heater is two-stage, it is most desirable to dispose the heaters so that the terminal portions may be located at the facing position, that is, 180° separated position. Further, when it has three or more stage heater, each heater should also be disposed so that the terminal portions may be located at each apex of a regular polygon, seeing from the axial direction of the heating furnace. That is, when the upper stage heater portion has N (N is a positive integer of three or more) heaters, the terminal portions of each heater should be disposed at each apex of a regular n-gon (n is an integer which satisfies 3≦n≦N), seeing from the axial direction of the heating furnace.

Furthermore, for example, when the upper stage heater portion has eight heaters, needless to say, the terminal portions of each heater may be disposed at each apex of a regular octagon, seeing from the axial direction of the heating furnace. By the way, those may also be disposed at each apex of a regular pentagon or a regular hexagon. In case being disposed at the apexes of the regular pentagon, two terminal portions will be disposed to be overlapped in three apexes out of the five apexes. In case being disposed at the apexes of the regular hexagon, two terminal portions will be disposed to be overlapped in two apexes out of the six apexes. Thus, when the upper stage heater portion has N numbers of heaters, as compared with the conventional method, the inplane temperature distribution in a furnace can be made uniform, even though the terminal portions of each heater is made to be located at the apex of a regular n-gon smaller than N. However, also in that case, as the heaters in which the terminal portions are disposed at the same apex, the adjacent ones are avoided, and the mutually separated ones are chosen. Moreover, the positions of the terminal portions are not required to be set strictly at the apexes of a regular polygon, but should be in the positions close to them.

INDUSTRIAL APPLICABILITY

In the above description, the CdZnTe single crystal growth by the VGF method, using the crystal growth apparatus according to the present invention, is explained as an example. However, the crystal growth apparatus according to the present invention can be applied when the CdZnTe is grown by the VB method, the HGF method and the HB method. Moreover, a compound to be grown is not restricted to CdZnTe, and for example, a compound semiconductor single crystal, such as GaAs or the like, can also be grown.

What is claimed is:

1. A crystal growth apparatus comprising:
   a cylindrical heating furnace, in which a plurality of heaters are laminated in a plurality of stages with respect to an axial direction of said cylindrical heating furnace, wherein terminal portions of adjacent heaters of said plurality of heaters are disposed in mutually separated positions as seen from the axial direction of the heating furnace.

2. The crystal growth apparatus as claimed in claim 1, wherein said plurality of heaters is of a pair of heaters and each heater of said pair of heaters is disposed with the terminal portions in an almost facing position.

3. The crystal growth apparatus as claimed in claim 1, wherein each heater is disposed with the terminal portions of the heaters located at each apex of a regular polygon as seen with respect to an axial direction of the heating furnace, wherein said polygon includes at least three sides with at least three respective apexes.

4. A crystal growth apparatus of a compound semiconductor, comprising:
   a heating furnace comprising an upper stage heater portion having a cylindrical heating furnace in which a plurality of heaters are laminated in a plurality of stages with respect to an axial direction of said cylindrical heating furnace, wherein terminal portions of adjacent heaters of said plurality of heaters are disposed in mutually separated positions as seen from the axial direction of the heating furnace; and
   a lower stage heater portion heating a reservoir portion in communication with a heat-resistant container, in which a crucible charged with a raw material will be sealed.

5. The crystal growth apparatus as claimed in claim 4, wherein said plurality of heaters is of a pair of heaters and each heater of said pair of heaters is disposed with the terminal portions in an almost facing position.

6. The crystal growth apparatus as claimed in claim 4, wherein each heater is disposed with the terminal portions of the heaters located at each apex of a regular polygon as seen with respect to an axial direction of the heating furnace, wherein said polygon includes at least three sides with at least three respective apexes.

7. A method for producing a single crystal, using crystal growth apparatus, wherein said crystal growth apparatus includes a cylindrical heating furnace in which a plurality of heaters are laminated in a plurality of stages with respect to an axial direction of said cylindrical heating furnace, wherein terminal portions of adjacent heaters of said plurality of heaters are disposed in mutually separated positions as seen from the axial direction of the heating furnace; said method comprising the steps of:
   arranging a heat-resistant container charged with a raw material in the heating furnace;
   maintaining a temperature distribution in the heating furnace by controlling the heaters;
   melting the raw material by heating the heat-resistant container to be over the melting point of the raw material; and thereafter
   growing a single crystal by gradually decreasing the temperature of the heating furnace, while maintaining the temperature distribution.

8. The method for producing the compound semiconductor single crystal as claimed in claim 7, wherein said plurality of heaters of said crystal growth apparatus is of a pair of heaters and each heater of said pair of heaters is disposed with the terminal portions in an almost facing position.

9. The method for producing the compound semiconductor single crystal as claimed in claim 7, wherein each heater of said crystal growth apparatus is disposed with the terminal portions of the heaters located at each apex of a regular polygon as seen with respect to an axial direction of the heating furnace, wherein said polygon includes at least three sides with at least three respective apexes.

10. The method for producing the compound semiconductor single crystal as claimed in claim 7, wherein the step of growing the crystal is accomplished by a VGF method.

11. The method for producing the compound semiconductor single crystal as claimed in claim 7, wherein the step of growing the crystal is accomplished by a VB method.

12. The method for producing the compound semiconductor single crystal as claimed in claim 7, wherein the step of growing the crystal is accomplished by a HGF method.

13. The method for producing the compound semiconductor single crystal as claimed in claim 7, wherein the step of growing the crystal is accomplished by a HB method.

14. The method for producing the compound semiconductor single crystal as claimed in claim 7, wherein the compound semiconductor single crystal is CdZnTe.

15. A method for producing a compound semiconductor single crystal, using a crystal growth apparatus having a heating furnace comprising an upper stage heater portion having a cylindrical heating furnace in which a plurality of heaters are laminated in a plurality of stages with respect to an axial direction of said cylindrical heating furnace, wherein terminal portions of adjacent heaters of said plurality of heaters are disposed in mutually separated positions as seen from the axial direction of the heating furnace and a lower stage heater portion heating a reservoir portion in communication with a heat-resistant container, in which a crucible charged with a raw material will be sealed, said method comprising the steps of:
   arranging a crucible charged with a raw material of a compound semiconductor in a quartz ampoule having a reservoir portion;
   charging a simple substance or a compound comprising at least one kind of volatile element among constituent elements of the compound semiconductor into the reservoir portion of the quartz ampoule;
   arranging the quartz ampoule in the heating furnace in order for the crucible to be located at an inside of an upper stage heater portion, and for the reservoir portion to be located at the inside of a lower stage heater portion;
   maintaining a temperature distribution in the heating furnace by controlling the upper stage heater portion;
   melting the raw material of the compound semiconductor by heating the heat-resistant container over the melting point of the raw material; thereafter
   evaporating the volatile element by heating the reservoir portion in the lower stage heater portion;
   controlling pressure in the quartz ampoule by vapor pressure of the volatile element; and
   growing a crystal by gradually decreasing the temperature in the heating furnace, while maintaining the temperature distribution.

16. The method for producing the compound semiconductor single crystal as claimed in claim 15, wherein said plurality of heaters of said crystal growth apparatus is of a pair of heaters and each heater of said pair of heaters is disposed with the terminal portions in an almost facing position.

17. The method for producing the compound semiconductor single crystal as claimed in claim 15, wherein each heater of said crystal growth apparatus is disposed with the terminal portions of the heaters located at each apex of a regular polygon as seen with respect to an axial direction of the heating furnace, wherein said polygon includes at least three sides with at least three respective apexes.

18. The method for producing the compound semiconductor single crystal as claimed in claim 15, wherein the step of growing the crystal is accomplished by at least one of a VGF method, a VB method, a HGF method and a HB method.

19. The method for producing the compound semiconductor single crystal as claimed in claim 18, wherein the compound semiconductor single crystal is CdZnTe.

20. The method for producing the compound semiconductor single crystal as claimed in claim 18, wherein the compound semiconductor single crystal is GaAs.

* * * * *